US007657801B2

(12) United States Patent
Fujiwara

(10) Patent No.: US 7,657,801 B2
(45) Date of Patent: Feb. 2, 2010

(54) TEST APPARATUS, PROGRAM, AND TEST METHOD

(75) Inventor: Masaki Fujiwara, Tokyo (JP)

(73) Assignee: Advantest Corporation, Tokyo (JP)

( * ) Notice: Subject to any disclaimer, the term of this patent is extended or adjusted under 35 U.S.C. 154(b) by 476 days.

(21) Appl. No.: 11/735,422

(22) Filed: Apr. 13, 2007

(65) Prior Publication Data
US 2008/0285366 A1 Nov. 20, 2008

(30) Foreign Application Priority Data
Apr. 14, 2006 (JP) .............................. 2006-111576

(51) Int. Cl.
*G11C 29/00* (2006.01)
*G01R 31/28* (2006.01)
*G01R 31/26* (2006.01)

(52) U.S. Cl. ........................ 714/718; 714/722; 714/724; 365/201; 324/765

(58) Field of Classification Search ........................ None
See application file for complete search history.

(56) References Cited

U.S. PATENT DOCUMENTS

| 4,958,345 | A | * | 9/1990 | Fujisaki .................... 714/720 |
| 4,958,346 | A | * | 9/1990 | Fujisaki .................... 714/720 |
| 5,455,909 | A | * | 10/1995 | Blomgren et al. ............. 714/43 |
| 5,644,578 | A | * | 7/1997 | Ohsawa ..................... 714/719 |
| 6,032,281 | A | * | 2/2000 | Fujisaki .................... 714/738 |
| 6,154,862 | A | * | 11/2000 | Tabata et al. ................ 714/719 |
| 6,601,204 | B1 | * | 7/2003 | Tsuto ....................... 714/739 |
| 6,687,861 | B1 | * | 2/2004 | Jordan et al. ................ 714/718 |
| 2001/0054141 | A1 | * | 12/2001 | Snodgrass et al. ............ 712/241 |

* cited by examiner

*Primary Examiner*—Kevin L Ellis
*Assistant Examiner*—Guerrier Merant
(74) *Attorney, Agent, or Firm*—Jianq Chyun IP Office

(57) ABSTRACT

There is provided a test apparatus that tests a device under test. The test apparatus includes an address generating circuit that generates a physical address to be supplied to a memory block inside the device under test, a plurality of mask registers being provided in correspondence with a plurality of memory input bits constituting at least a part of a memory input address to be supplied to the device under test, where the plurality of mask registers set values indicating whether a plurality of physical bits constituting the physical address is masked every the physical bit, a plurality of mask arithmetic circuits being provided in correspondence with each of the plurality of memory input bits, where the plurality of mask arithmetic circuits respectively mask the physical address in accordance with the value of the mask register corresponding to this memory input bit, a plurality of logical operation circuits being provided in correspondence with each of the plurality of memory input bits, where the plurality of logical operation circuits respectively output bit data obtained by performing a predetermined logical operation on a masking result by the mask arithmetic circuit as the memory input bit, and an address supplier that supplies the input address including the plurality of memory input bits output from the plurality of logical operation circuits to the device under test.

15 Claims, 8 Drawing Sheets

TEST APPARATUS, PROGRAM, AND TEST METHOD

CROSS REFERENCE TO RELATED APPLICATION

The present application claims priority from a Japanese Patent Application No. 2006-111576 filed on Apr. 14, 2006, the contents of which are incorporated herein by reference.

BACKGROUND

1. Technical Field

The present invention relates to a test apparatus, a program, and a test method. More particularly, the present invention relates to a test apparatus, a program, and a test method for controlling an address value of an address to be supplied to a memory under test.

2. Related Art

In the present memory device, a memory input address that is input to designate a storage cell from the outside and a physical address that shows arrangement of storage cells within the memory device are different from each other. That is to say, the memory device translates a memory input address designated from the outside into a physical address according to a data reading request, and then outputs the contents of a storage cell designated by the physical address. By doing in this way, although a continuous memory area is designated from the outside, it is possible to improve an access speed by alternately accessing a plurality of memory banks and access a preliminary storage cell in place of a storage cell proved to be false after manufacturing.

Now, since a related patent document is not recognized, the description is omitted.

A physical position of each storage cell may relate to badness for the memory device. For example, when a memory device has wiring badness, data written in a certain storage cell may be written in another storage cell adjacent to the storage cell. In order to detect such badness, it is necessary that a test apparatus writes data in a certain storage cell and reads data from another storage cell adjacent to the storage cell. For this reason, it is desirable that the test apparatus can access each storage cell by means of a physical address.

In order to realize this, a conventional test apparatus has a translation memory that stores a translation table for translating a physical address into a memory input address. This translation memory stores a memory input address in an address designated by a physical address. A conventional test apparatus translates a generated physical address into a memory input address by means of this translation memory and supplies the translated address to a device under test. However, when bus width of an address of a memory device increases with high performance of the memory device, necessary capacitance of the translation memory increases and thus maintenance and management costs for the test apparatus may increase.

SUMMARY

Therefore, an advantage of some embodiments of the present invention is to provide a test apparatus, a program, and a test method that can solve the foregoing problems. The above and other objects can be achieved by combinations described in the independent claims. The dependent claims define further advantageous and exemplary combinations of the present invention.

To solve this problem, according to the first aspect of the present invention, there is provided a test apparatus that tests a device under test having a memory block inside. The test apparatus includes an address generating circuit that generates a physical address to be supplied to the memory block inside the device under test, a plurality of mask registers being provided in correspondence with each of a plurality of memory input bits constituting at least a part of a memory input address to be supplied to the device under test, where the plurality of mask registers set values indicating whether a plurality of physical bits constituting at least a part of the physical address is masked every the physical bit, a plurality of mask arithmetic circuits being provided in correspondence with each of the plurality of memory input bits, where the plurality of mask arithmetic circuits respectively mask the physical address in accordance with the value set by the mask register corresponding to this memory input bit, a plurality of logical operation circuits being provided in correspondence with each of the plurality of memory input bits, where the plurality of logical operation circuits respectively output bit data obtained by performing a predetermined logical operation on a masking result by the mask arithmetic circuit as the memory input bit, and an address supplier that supplies the memory input address including the plurality of memory input bits output from the plurality of logical operation circuits to the device under test.

Moreover, each of the logical operation circuits may compute an exclusive OR of the masked plurality of physical bits output from the plurality of mask arithmetic circuits and output the bit data based on the computed exclusive OR as the memory input bit. The test apparatus may further include an inversion control register being provided in correspondence with each of the plurality of memory input bits. The inversion control register may set whether a logical value of the exclusive OR computed by the logical operation circuit is reversed and output as the memory input bit.

Moreover, the test apparatus may further include a translation memory that inputs a translated address consisting of bits of at least a part of the physical address and outputs data associated with this translated address as a destination address, and a selecting section that selects which of an address including the destination address in bits of at least a part thereof and an address including the plurality of memory input bits output from the plurality of logical operation circuits is output as the memory input address. Here, the address supplier may supply the memory input address output from the selecting section to the device under test.

Moreover, the test apparatus may further include an acquiring section that acquires a correspondence between the physical address and the memory input address, a deciding section that decides whether address translation designated by the correspondence acquired by the acquiring section is capable of being performed by means of a logical operation by the plurality of mask arithmetic circuits and the plurality of logical operation circuits, a setting section that sets the plurality of mask registers when it has been judged that the address translation is capable of being performed by means of the logical operation and sets contents of the translation memory when it has been judged that the address translation is not capable of being performed by means of the logical operation, and a control section that sets the selecting section so that the address including the plurality of memory input bits output from the plurality of logical operation circuits is output as the memory input address when it has been judged that the address translation is capable of being performed by means of the logical operation and sets the selecting section so that the address including the destination address in bits of at least a part thereof is output as the memory input address when it has been judged that the address translation is not capable of being performed by means of the logical operation.

According to the second aspect of the present invention, there is provided a recording medium storing thereon a program for a control apparatus for controlling a test apparatus that tests a device under test. The program causes the test apparatus to perform a test method including generating a physical address to be supplied to a memory block inside the device under test, masking, in correspondence with each of a plurality of memory input bits constituting at least a part of a memory input address to be supplied to the device under test, each of a plurality of physical bits constituting at least a part of the physical address in accordance with a value of a mask register corresponding to this memory input bit, respectively outputting bit data obtained by performing a predetermined logical operation on the plurality of physical bits in correspondence with each of the plurality of memory input bits as the memory input bit, and supplying the memory input address including the output plurality of memory input bits to the device under test.

Moreover, when bit data obtained by performing a logical operation is output as the memory input bit, an exclusive OR of the masked plurality of physical bits may be computed and the bit data based on the computed exclusive OR may be output as the memory input bit. In correspondence with each of the plurality of memory input bits, whether a logical value of the exclusive OR is reversed and output as the memory input bit may be set.

Based on a translated address consisting of bits of at least a part of the physical address, a destination address may be output by using a translation memory that outputs data associated with this translated address as the destination address, one of an address including the destination address in bits of at least a part thereof and an address including the plurality of memory input bits output in the plurality of logical operations may be selected to be output as the memory input address, and the selected memory input address may be supplied to the device under test, when the memory input address is supplied to the device under test.

A correspondence between the physical address and the memory input address may be acquired, whether address translation designated by the acquired correspondence is capable of being performed by means of the mask arithmetic operation and the logical operation may be decided, the plurality of mask registers may be set when it has been judged that the address translation is capable of being performed by means of the logical operation and contents of the translation memory may be set when it has been judged that the address translation is not capable of being performed by means of the logical operation, and in the selecting, the selecting section may be set so that the address including the plurality of memory input bits output as a result of the logical operation is output as the memory input address when it has been judged that the address translation is capable of being performed by means of the logical operation, and the address including the destination address in bits of at least a part thereof may be output as the memory input address when it has been judged that the address translation is not capable of being performed by means of the logical operation.

According to the third aspect of the present invention, there is provided a test method for testing a device under test by means of a test apparatus. The test method includes generating a physical address to be supplied to a memory block inside the device under test, masking, in correspondence with each of a plurality of memory input bits constituting at least a part of a memory input address to be supplied to the device under test, each of a plurality of physical bits constituting at least a part of the physical address in accordance with a value of a mask register corresponding to this memory input bit, respectively outputting bit data obtained by performing a predetermined logical operation on the plurality of physical bits in correspondence with each of the plurality of memory input bits as the memory input bit, and supplying the memory input address including the output plurality of memory input bits to the device under test.

Moreover, when bit data obtained by performing a logical operation is output as the memory input bit, an exclusive OR of the masked plurality of physical bits may be computed and the bit data based on the computed exclusive OR may be output as the memory input bit. In correspondence with each of the plurality of memory input bits, whether a logical value of the exclusive OR is reversed and output as the memory input bit may be set.

Moreover, based on a translated address consisting of bits of at least a part of the physical address, a destination address may be output by using a translation memory that outputs data associated with this translated address as the destination address, one of an address including the destination address in bits of at least a part thereof and an address including the plurality of memory input bits output in the plurality of logical operations may be selected to be output as the memory input address, and the selected memory input address may be supplied to the device under test, when the memory input address is supplied to the device under test.

Moreover, a correspondence between the physical address and the memory input address may be acquired, whether address translation designated by the acquired correspondence is capable of being performed by means of the mask arithmetic operation and the logical operation may be decided, the plurality of mask registers may be set when it has been judged that the address translation is capable of being performed by means of the logical operation and contents of the translation memory may be set when it has been judged that the address translation is not capable of being performed by means of the logical operation, and in the selecting, the selecting section may be set so that the address including the plurality of memory input bits output as a result of the logical operation is output as the memory input address when it has been judged that the address translation is capable of being performed by means of the logical operation, and the address including the destination address in bits of at least a part thereof may be output as the memory input address when it has been judged that the address translation is not capable of being performed by means of the logical operation.

The summary of the invention does not necessarily describe all necessary features of the present invention. The present invention may also be a sub-combination of the features described above.

DESCRIPTION OF EXEMPLARY EMBODIMENTS

The invention will now be described based on the preferred embodiments, which do not intend to limit the scope of the present invention, but exemplify the invention. All of the features and the combinations thereof described in the embodiment are not necessarily essential to the invention.

Figure 1:
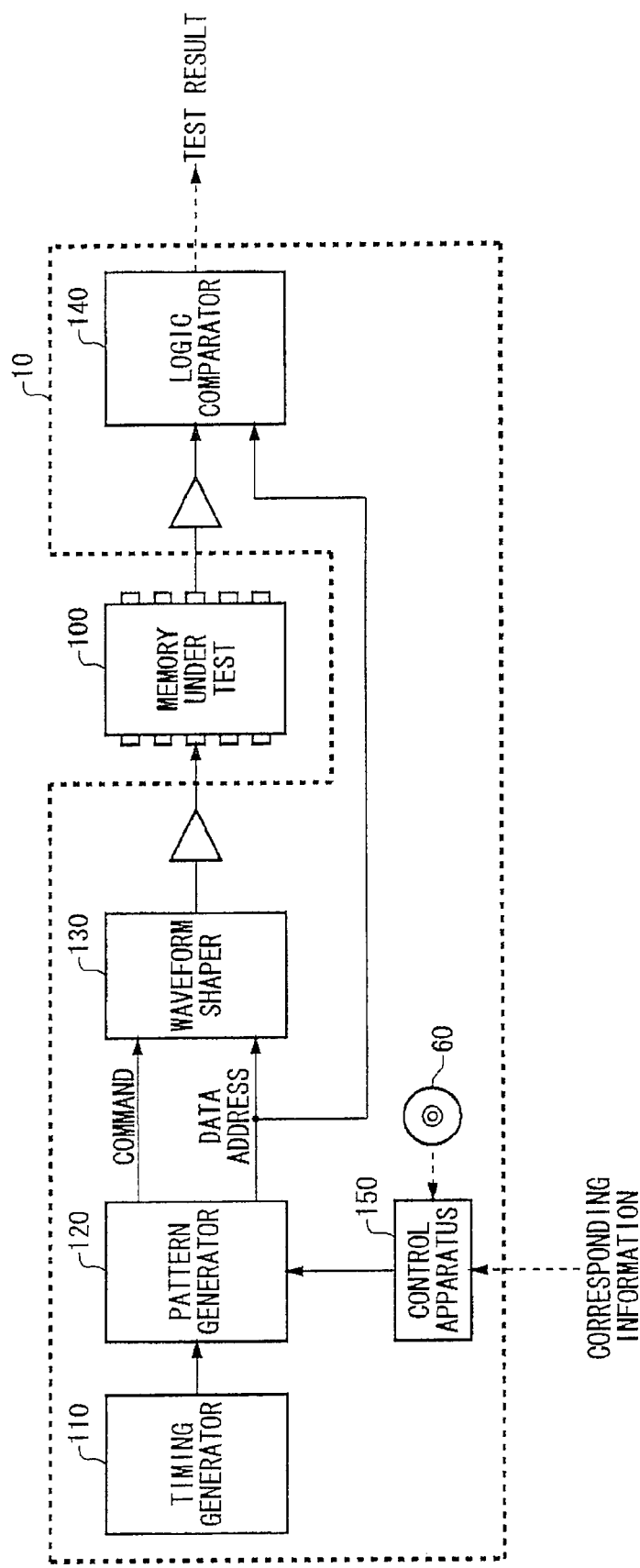
FIG. 1 shows an entire configuration of a test apparatus 10.

FIG. 1 shows an entire configuration of a test apparatus 10. The test apparatus 10 includes a timing generator 110, a pattern generator 120, a waveform shaper 130, a logic comparator 140, and a control apparatus 150, and tests a memory under test 100 that is a semiconductor memory device or the like. The timing generator 110 generates a reference clock such as a cycle clock to supply the reference clock to the pattern generator 120. The pattern generator 120 generates test pattern data to be input into the memory under test 100, a memory input address to be input into the memory under test 100, and a control command to be input into the memory under test 100, based on the cycle clock. Then, the pattern generator 120 outputs these data, memory input address, and control command to the waveform shaper 130. Moreover, the pattern generator 120 outputs test pattern data to the logic comparator 140 as expectation data.

The waveform shaper 130 shapes the input test pattern, memory input address, and control command into a signal waveform capable of being input into the memory under test 100 and supplies the signal waveform to the memory under test 100. The logic comparator 140 reads data stored on the memory under test 100 and compares the read data with the expectation data input from the pattern generator 120. If the read data are equal to the expectation data, the logic comparator 140 outputs a test result showing that the memory under test 100 is a non-defective unit. The control apparatus 150 performs various types of settings on the pattern generator 120. Specifically, the control apparatus 150 performs setting for translating a physical address that shows physical arrangement of storage cells included in the memory under test 100 into a memory input address that should be input from an outside of the memory under test 100 in order to access the memory under test 100.

Figure 2:
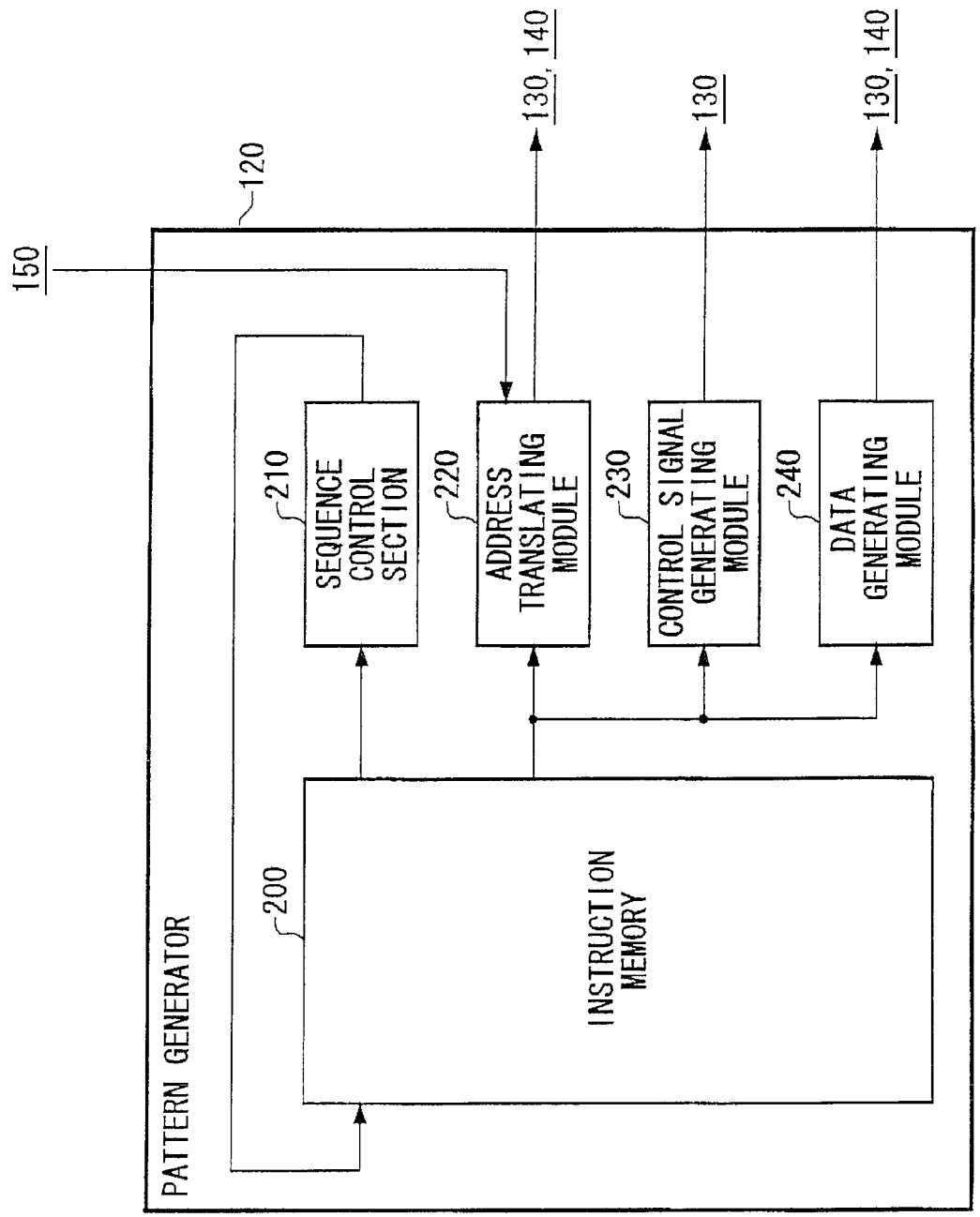
FIG. 2 shows a functional configuration of a pattern generator 120.

FIG. 2 shows a functional configuration of the pattern generator 120. The pattern generator 120 has an instruction memory 200, a sequence control section 210, an address translating module 220, a control signal generating module 230, and a data generating module 240. The instruction memory 200 stores a program based on an algorithm for controlling a test. This program includes information for generating test data, physical addresses, and control commands to be supplied to the memory under test 100 in each process step for a test, in addition to instructions that are executed by the sequence control section 210 to change a control flow.

The sequence control section 210 plays a role as an address generating section according to the present invention. Specifically, the sequence control section 210 carries out the instructions included in the program stored on the instruction memory 200 to generate test data, physical addresses, and control commands. Here, a physical address is not an address that should be supplied from an outside of the memory under test 100, but is a physical address to be supplied to a memory block inside the memory under test 100. That is to say, a physical address shows arrangement of storage cells within a memory block. An execution result for each instruction is input into the instruction memory 200, and then an instruction to be next executed is read from the instruction memory 200 and is input into the sequence control section 210.

The address translating module 220 translates the physical address output from the instruction memory 200 into a memory input address according to a process performed by the sequence control section 210, and outputs the memory input address to the waveform shaper 130 and the logic comparator 140. The address translating module 220 may receive setting for a translation rule of an address from the control apparatus 150. The control signal generating module 230 outputs a control command output from the instruction memory 200 to the waveform shaper 130 according to a process performed by the sequence control section 210. The data generating module 240 outputs test data output from the instruction memory 200 to the waveform shaper 130 and the logic comparator 140 according to a process performed by the sequence control section 210.

Figure 3:
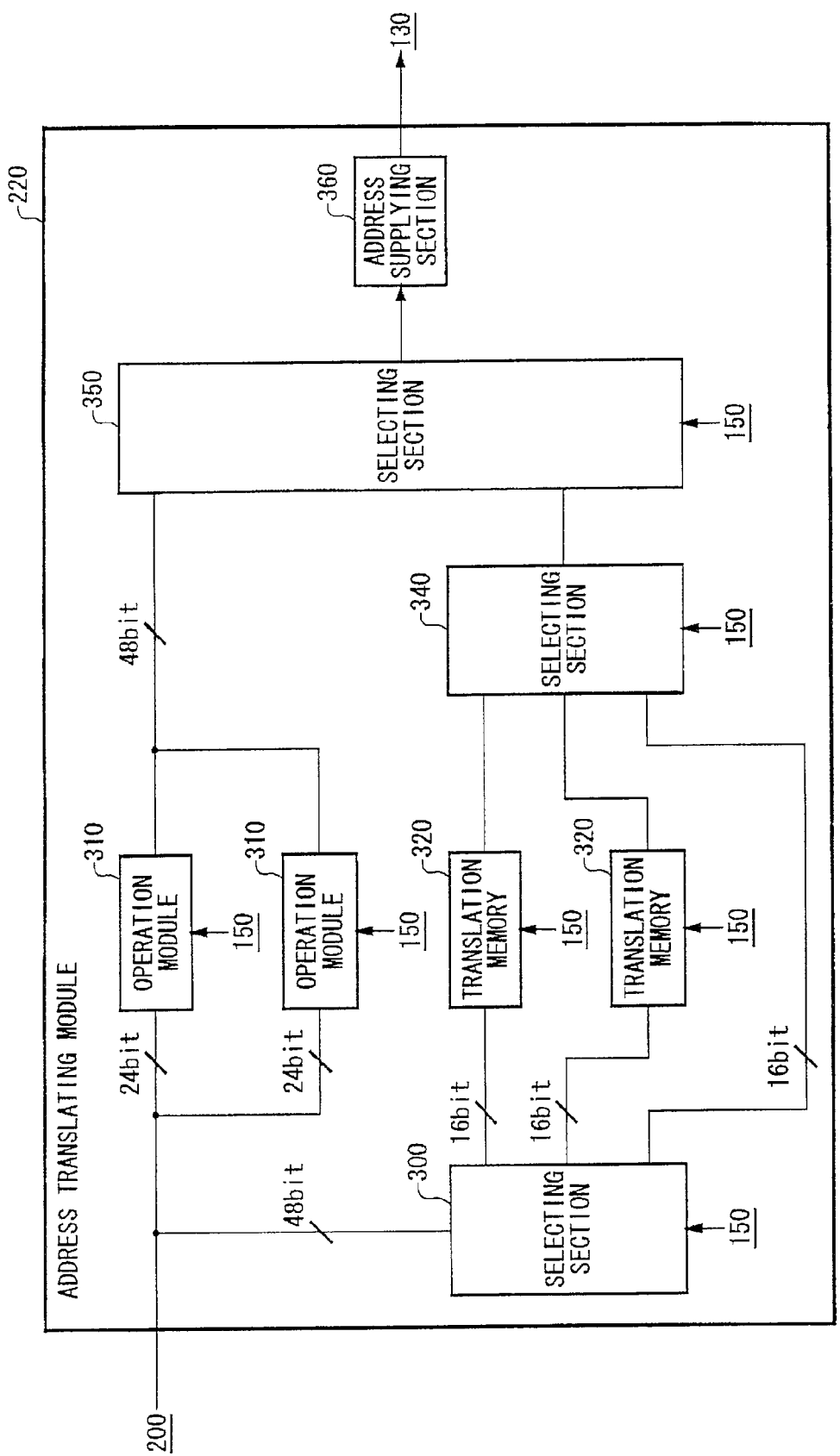
FIG. 3 shows a functional configuration of an address translating module 220.

FIG. 3 shows a functional configuration of the address translating module 220. The address translating module 220 has a selecting section 300, two operation modules 310, two translation memories 320, a selecting section 340, a selecting section 350, and an address supplying section 360. The address translating module 220 receives the physical address from the instruction memory 200. It is assumed that an address width of this physical address is 48 bits. The selecting section 300 selects 16 bits from a plurality of physical bits constituting the physical address and outputs the selected bits to one of the translation memories 320. Moreover, the selecting section 300 selects other 16 bits from the plurality of physical bits constituting the physical address and outputs the selected other bits to the other of the translation memories 320. The selecting section 300 may select which group of the physical bits is output to one of the translation memories 320 based on the setting received from the control apparatus 150.

Each of the translation memories 320 inputs a translated address consisting of bits of at least a part of the physical address and outputs data associated with the translated address as a destination address. For example, each of the translation memories 320 translates 16 bits among physical bits constituting the physical address into 16 bits among memory input bits constituting the memory input address, and outputs the translated bits to the selecting section 340. The remaining physical bits that have not been converted by the two translation memories 320 are output to the selecting section 340 as the memory input bit without modification. The selecting section 340 rearranges the memory input bit by 16 bits output from each of the translation memories 320 and the remaining physical bits output from the selecting section 300, and outputs the rearranged bits to the selecting section 350. That is to say, an address output to the selecting section 350 includes a destination address translated by the translation memory 320 in bits of at least a part thereof.

Each of the operation modules 310 receives 24 bits among physical bits constituting the physical address. Each of the operation modules 310 generates bit data obtained by performing a logical operation on 24 physical bits as 24-bit memory input bits constituting the memory input data, and outputs the bit data to the selecting section 350. The selecting section 350 selects which of the memory input address output by the selecting section 340 and the address including the plurality of memory input bits output from the plurality of operation modules 310 is output as the memory input address. This selection may be performed based on setting by the control apparatus 150. The address supplying section 360 supplies the memory input address output from the selecting section 350 to the memory under test 100 via the waveform shaper 130.

As described above, according to a configuration shown in FIG. 3, a translation memory for address translation is not required and thus an increase of facility size of the test apparatus 10 can be prevent even if a memory device has a high performance. Furthermore, the test apparatus 10 can maintain interchangeability with a conventional test apparatus by means of using a translation memory together when bus the width of an address is narrow. For example, although a user has conventional software for generating data of a translation memory, the test apparatus 10 according to the present embodiment can be used without modification.

Figure 4:
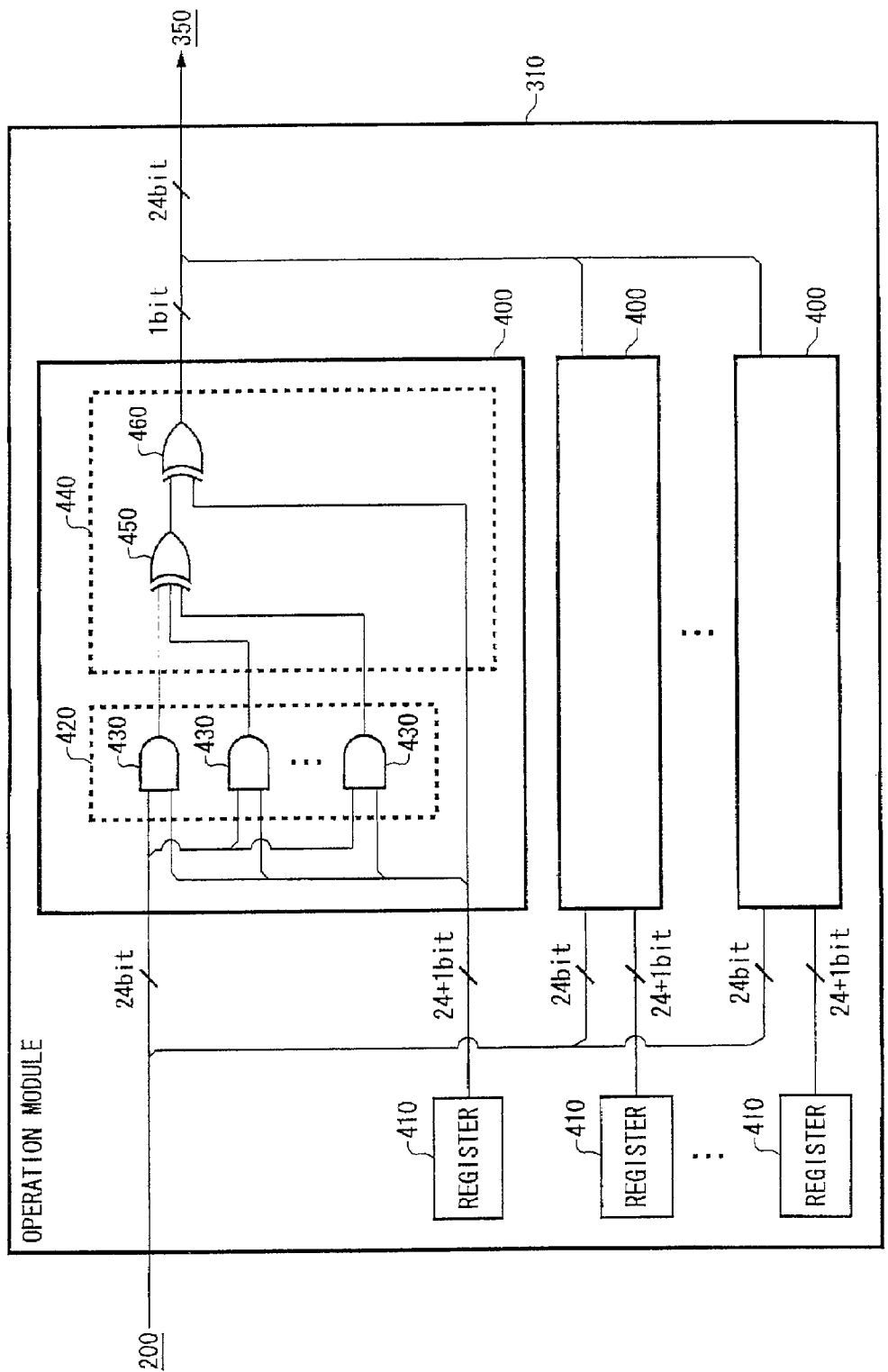
FIG. 4 shows a functional configuration of an operation module 310.

FIG. 4 shows a functional configuration of the operation module 310. In FIG. 4, one of the two operation modules 310 is described as a representative. Since the other operation module 310 has the substantially same configuration as that of this operation module 310, its description is omitted. The operation module 310 has a plurality of bit arithmetic sections 400 and a plurality of registers 410. Each of the plurality of bit arithmetic sections 400 is provided in correspondence with each of the plurality of memory input bits constituting at least a part of the memory input address to be supplied to the memory under test 100. Each of the plurality of bit arithmetic sections 400 in an example of FIG. 4 is provided in correspondence with all memory input bits constituting the memory input address. Moreover, each of the plurality of registers 410 is provided in correspondence with each of the plurality of memory input bits.

Each of the registers 410 functions as each of a mask register and an inversion control register according to the present invention. The register 410 stores 25-bit mask data in an example of FIG. 4. In case of a logical operation for generating a memory input address from a physical address by means of mask data of low-order 24 bits, the register 410 sets whether a plurality of physical bits constituting at least a part of a physical address is masked every physical bit. Moreover, the register 410 sets whether a logical value of an exclusive OR computed by the logical operation section 440 is reversed by means of high-order one-bit mask data to be output as a memory input bit.

Each of the bit arithmetic sections 400 has a mask arithmetic section 420 and a logical operation section 440. Each of the mask arithmetic sections 420 inputs a physical address. Then, the mask arithmetic section 420 corresponding to each memory input bit masks the physical address in accordance with a value of the register 410 corresponding to this memory input bit. As a specific example of a configuration, the mask arithmetic section 420 has an AND gate 430 corresponding to each physical bit. The AND gate 430 obtains a logical product of the corresponding physical bit and the corresponding bit in mask data stored on the register 410 to output the logical product to the logical operation section 440.

The logical operation section 440 corresponding to each memory input bit outputs bit data obtained by performing a predetermined logical operation on a masking result by the mask arithmetic section 420 as this memory input bit. Specifically, the logical operation section 440 has an exclusive OR gate 450 that computes an exclusive OR of the masked plurality of physical bits output from the corresponding mask arithmetic section 420. Then, the logical operation section 440 outputs bit data based on the computed exclusive OR as the memory input bit. The logical operation section 440 may further have an exclusive OR gate 460 that reverses a logical value of the computed exclusive OR based on high-order one-bit mask data of the register 410 and outputs the reversed value as the memory input bit. In this way, the memory input address including the plurality of memory input bits output from the plurality of logical operation sections 440 is output to the address supplying section 360 via the selecting section 350, and is supplied by the address supplying section 360 to the memory under test 100.

Figure 5:
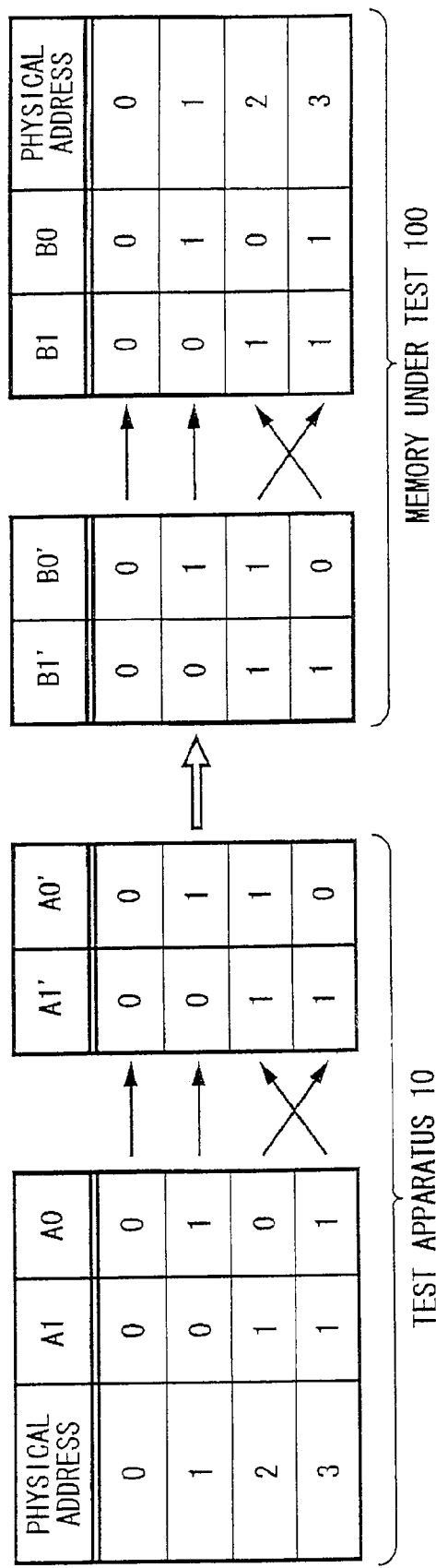
FIG. 5 shows a specific example of translating a physical address into a memory input address by means of an address translating module 220.

FIG. 5 shows a specific example of translating a physical address into a memory input address by means of the address translating module 220. In the present drawing, the left side shows translation by the test apparatus 10 and the right side shows translation by the memory under test 100. According to the right side, the memory under test 100 translates memory input bits B1' and B0' constituting the memory input address into physical bits B1 and B0. This translation of the bit B1' generates an exclusive OR of the bit B1' and the bit B0' as the bit B0 without translating the bit B 1' into B1 as it is. Therefore, it is necessary to specify 0th, 1st, 3rd, and 2nd address as the memory input address in this turn, for example, in order to continuously access physical addresses of 0th to 3rd address.

In order to appropriately access each storage cell along the generated physical address, the test apparatus 10 translates the physical address into a memory input address and supplies the translated address to the memory under test 100. In the left side of the present drawing, the test apparatus 10 generates physical addresses of 0th to 3rd address in this turn. The address translating module 220 translates physical bits A1 and A0 constituting the physical address into memory input bits A1' and A0' constituting the memory input address. According to this translation, the bit A1 becomes the bit A1' as it is, and an exclusive OR of the bit A1 and the bit A0 becomes the bit A0'. By performing such translation, it is possible to access storage cells in the memory under test 100 along the generated physical address.

Figure 6:
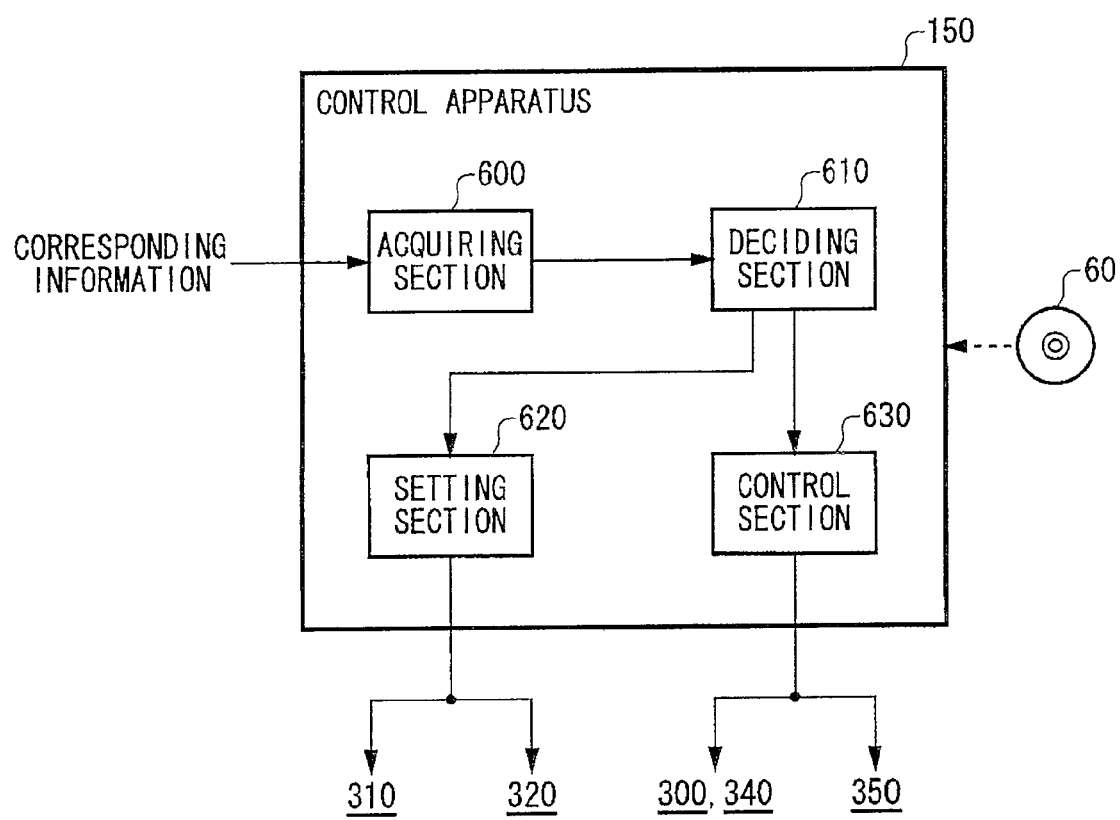
FIG. 6 shows a functional configuration of a control apparatus 150.

FIG. 6 shows a functional configuration of the control apparatus 150. The control apparatus 150 has an acquiring section 600, a deciding section 610, a setting section 620, and a control section 630. The acquiring section 600 acquires corresponding information showing correspondence between a physical address and a memory input address. For example, corresponding information may be tabular-form data writing correspondence between a physical address and a memory input address, or may be a program showing computation for obtaining the memory input address from the physical address. That is to say, the acquiring section 600 acquires the data or the program via communication lines, and stores the acquired data or program on a storage device such as a memory and a hard disk.

The deciding section 610 decides whether address translation designated by corresponding information can be performed by means of logical operations by the plurality of mask arithmetic sections 420 and the plurality of logical operation sections 440. In the present embodiment, it is specifically decided whether each memory input bit can be generated by means of an exclusive OR of singular or plural physical bits and an inversion operation of a logical value. A concrete decision process is illustrated about when acquiring a program as corresponding information. First, the deciding section 610 abridges a logical operation shown by corresponding information by means of executing a program (conventionally known) realizing simplification of a logical expression. Then, the deciding section 610 judges that the memory input bits can be generated by the logical operation when the abridged logical operation includes only one-step exclusive OR and one-step of inversion operation. On the other hand, when the abridged logical operation includes operations other than one-step exclusive OR and one-step of inversion operation, the deciding section 610 decides that memory input bits cannot be generated by the logical operation.

The setting section 620 sets the plurality of registers 410 when it has been judged that the address translation could be performed by means of these logical operations. Specifically, the setting section 620 sets a bit corresponding to a physical bit used for a logical operation obtaining the memory input bit as a logical value of one in the register 410 corresponding to each memory input bit. The setting section 620 sets the other bits as a logical value of zero. On the other hand, the setting section 620 sets contents of the translation memory 320 when it has been judged that the address translation cannot be performed by means of these logical operations. Specifically, the setting section 620 inputs all values capable of being obtained as a physical address into a program of a logical operation shown by corresponding information and obtains the operation result. Then, the setting section 620 causes a region of which an address is each physical address in the translation memory 320 store the above operation result obtained by performing the physical address as an input.

The control section 630 sets the selecting section 350 so that an address including the plurality of memory input bits output from the plurality of logical operation sections 440 is output as the memory input address, when it has been judged that address translation can be performed by means of the logical operation by the operation module 310. On the other hand, the control section 630 sets the selecting section 350 so that an address including a destination address by the translation memory 320 in bits of at least a part thereof is selected as the memory input address, when it has been judged that the address translation cannot be performed by means of the logical operation by the operation module 310. In this case, the control section 630 may further perform setting showing which of the physical bits is input into the translation memory 320 on the selecting section 300 and the selecting section 340.

As described above, for example, the control apparatus 150 described with reference to FIG. 6 may be an information processing apparatus such as a personal computer or a workstation. Each function of the control apparatus 150 may be realized by a program recorded on a recording medium 60 that is a CD-ROM or a DVD-ROM. That is to say, a program is read from the recording medium 60, and is installed and executed in the control apparatus 150. Then, a central processing unit provided in the control apparatus 150 functions as the acquiring section 600, the deciding section 610, the setting section 620, and the control section 630 by means of the installed program. Since each function that is realized by the cooperation of the program and the control apparatus 150 is equal to a function of each member described with reference to FIG. 6, their descriptions are omitted.

Figure 7:
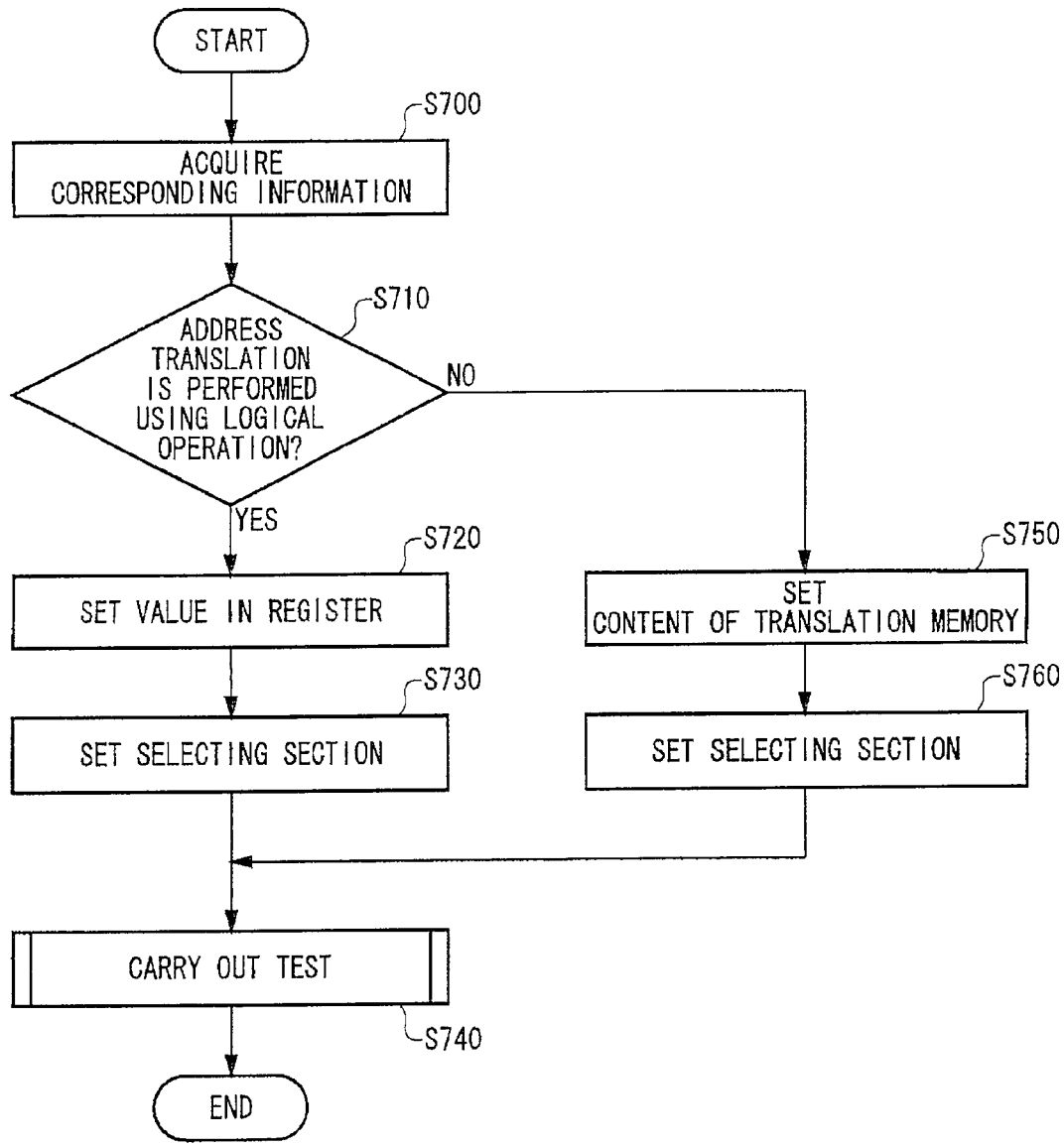
FIG. 7 shows a flowchart of a process for setting an address translation rule from a physical address to a memory input address.

FIG. 7 shows a flowchart of a process for setting an address translation rule from a physical address to a memory input address. The acquiring section 600 acquires corresponding information showing correspondence between a physical address and a memory input address (S700). The deciding section 610 decides whether address translation designated by corresponding information can be performed by means of logical operations by the plurality of mask arithmetic sections 420 and the plurality of logical operation sections 440 (S710). In an example of FIG. 4, it is specifically decided whether each memory input bit can be generated by an exclusive OR of singular or plural physical bits and an inversion operation of a logical value.

When it has been judged that the address translation can be performed by means of these logical operations (S710: YES), the setting section 620 sets a value in the plurality of registers 410 (S720). Then, the control section 630 sets the selecting section 350 so that an address including the plurality of memory input bits output from the plurality of logical operation sections 440 is output as the memory input address (S730). Then, the test apparatus 10 executes a test for the memory under test 100 based on these settings (S740).

On the other hand, when it has been judged that the address translation cannot be performed by means of these logical operations (S710: NO), the setting section 620 sets contents of the translation memory 320 (S750). Then, the control section 630 sets the selecting section 350 so that an address including a destination address by the translation memory 320 in bits of at least a part thereof is selected as the memory input address (S760). Then, the test apparatus 10 executes a test for the memory under test 100 based on these settings (S 740).

Figure 8:
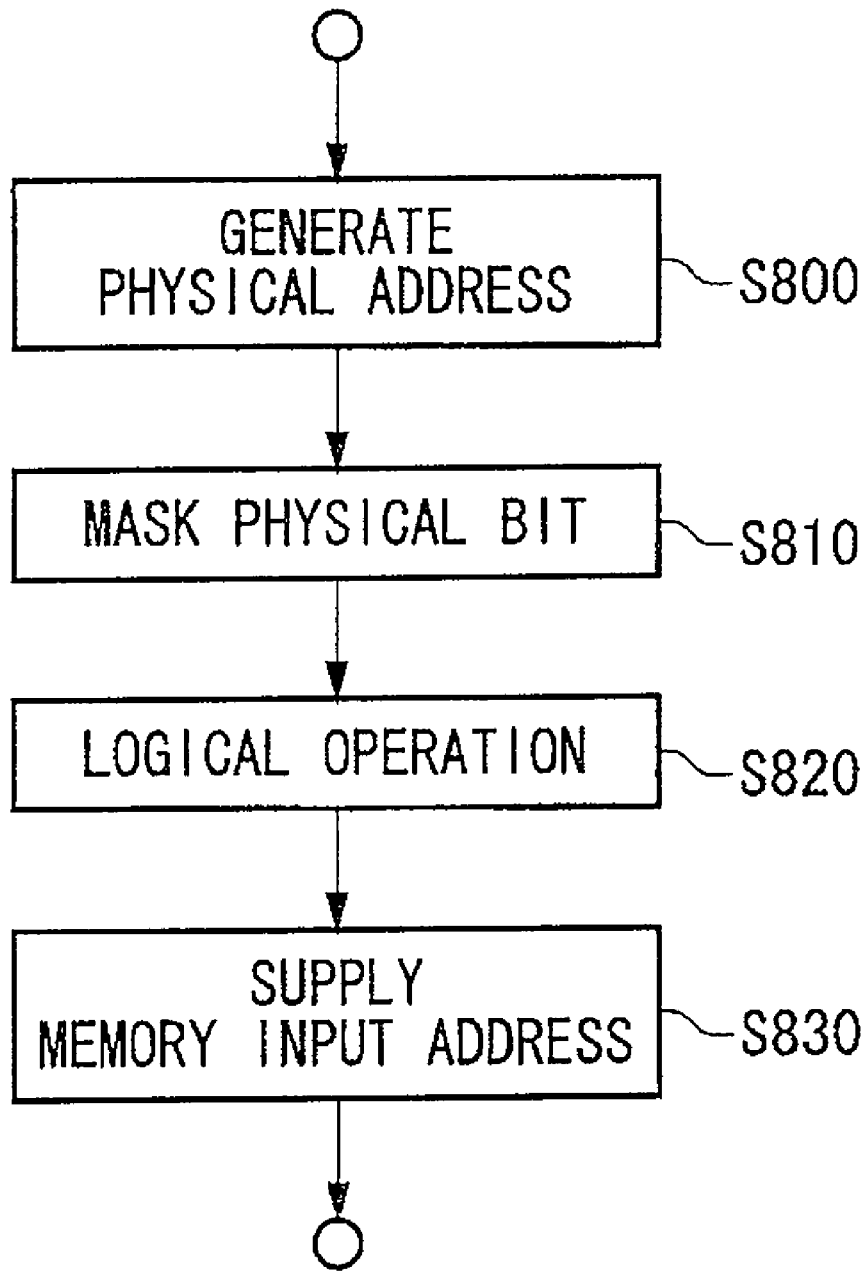
FIG. 8 shows a flowchart of a process for testing a memory under test 100.

FIG. 8 shows a flowchart of a process for testing the memory under test 100. The sequence control section 210 generates a physical address to be supplied to a memory block inside the memory under test 100 (S800). Next, each of the mask arithmetic sections 420 masks, in correspondence with each of the plurality of memory input bits, each of the plurality of physical bits constituting at least a part of the physical address in accordance with a value of the register 410 corresponding to this memory input bit (S810). Then, the logical operation section 440 respectively outputs bit data obtained by performing a predetermined logical operation on a masking result by the mask arithmetic section 420 as the memory input bit in correspondence with each of the plurality of memory input bits (S820). The output plurality of memory input bits is selected as the memory input address in accordance with the setting received by the selecting section 350, and is supplied to the memory under test 100 (S830).

As described above, according to the test apparatus 10 of the present embodiment, necessary capacitance of a translation memory may not be increased even if a memory device has high performance, and thus maintenance and management costs of the test apparatus 10 can be reduced. Moreover, since a small quantity of translation memory can be mounted, the test apparatus 10 can be interchanged with a conventional test apparatus. Furthermore, address translation is automatically set in the translation memory or the logic circuit by means of a program that judges which of the translation memory and the logic circuit should be used. According to this, although a user does not know memory capacity or the like of the translation memory mounted in the test apparatus 10, desired address translation is realized using an appropriate member among the translation memory and the operation module.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As clearly shown by the above description, according to the present invention, it is possible to effectively detect badness related to physical arrangement of storage cells in a memory device than ever before.

What is claimed is:

1. A test apparatus that tests a device under test having a memory block inside, comprising:
    an address generating circuit that generates a physical address to be supplied to the memory block inside the device under test;

a plurality of mask registers being provided in correspondence with each of a plurality of memory input bits constituting at least a part of a memory input address to be supplied to the device under test, the plurality of mask registers setting values indicating whether a plurality of physical bits constituting at least a part of the physical address is masked every the physical bit;

a plurality of mask arithmetic circuits being provided in correspondence with each of the plurality of memory input bits, the plurality of mask arithmetic circuits respectively masking the physical address in accordance with the value set by the mask register corresponding to this memory input bit;

a plurality of logical operation circuits being provided in correspondence with each of the plurality of memory input bits, the plurality of logical operation circuits respectively outputting bit data obtained by performing a predetermined logical operation on a masking result by the mask arithmetic circuit as the memory input bit; and an address supplier that supplies the memory input address including the plurality of memory input bits output from the plurality of logical operation circuits to the device under test.

2. The test apparatus as claimed in claim 1, wherein each of the logical operation circuits computes an exclusive OR of the masked plurality of physical bits output from the plurality of mask arithmetic circuits and outputs the bit data based on the computed exclusive OR as the memory input bit.

3. The test apparatus as claimed in claim 2, further comprising an inversion control register being provided in correspondence with each of the plurality of memory input bits, the inversion control register setting whether a logical value of the exclusive OR computed by the logical operation circuit is reversed and output as the memory input bit.

4. The test apparatus as claimed in claim 1, wherein the test apparatus further comprises:

a translation memory that inputs a translated address consisting of bits of at least a part of the physical address and outputs data associated with this translated address as a destination address; and a selecting section that selects which of an address including the destination address in bits of at least a part thereof and an address including the plurality of memory input bits output from the plurality of logical operation circuits is output as the memory input address, and the address supplier supplies the memory input address output from the selecting section to the device under test.

5. The test apparatus as claimed in claim 4, further comprising:

an acquiring section that acquires a correspondence between the physical address and the memory input address;

a deciding section that decides whether address translation designated by the correspondence acquired by the acquiring section is capable of being performed by means of a logical operation by the plurality of mask arithmetic circuits and the plurality of logical operation circuits;

a setting section that sets the plurality of mask registers when it has been judged that the address translation is capable of being performed by means of the logical operation and sets contents of the translation memory when it has been judged that the address translation is not capable of being performed by means of the logical operation; and a control section that sets the selecting section so that the address including the plurality of memory input bits output from the plurality of logical operation circuits is output as the memory input address when it has been judged that the address translation is capable of being performed by means of the logical operation and sets the selecting section so that the address including the destination address in bits of at least a part thereof is output as the memory input address when it has been judged that the address translation is not capable of being performed by means of the logical operation.

6. A recording medium storing thereon a program for a control apparatus for controlling a test apparatus that tests a device under test, the program causing the test apparatus to perform a test method comprising:

generating a physical address to be supplied to a memory block inside the device under test;

masking, in correspondence with each of a plurality of memory input bits constituting at least a part of a memory input address to be supplied to the device under test, each of a plurality of physical bits constituting at least a part of the physical address in accordance with a value of a mask register corresponding to this memory input bit;

respectively outputting bit data obtained by performing a predetermined logical operation on the plurality of physical bits in correspondence with each of the plurality of memory input bits as the memory input bit; and supplying the memory input address including the output plurality of memory input bits to the device under test.

7. The recording medium as claimed in claim 6, wherein when bit data obtained by performing a logical operation is output as the memory input bit, an exclusive OR of the masked plurality of physical bits is computed and the bit data based on the computed exclusive OR is output as the memory input bit.

8. The recording medium as claimed in claim 7, wherein in correspondence with each of the plurality of memory input bits, whether a logical value of the exclusive OR is reversed and output as the memory input bit is set.

9. The recording medium as claimed in claim 6, wherein based on a translated address consisting of bits of at least a part of the physical address, a destination address is output by using a translation memory that outputs data associated with this translated address as the destination address, one of an address including the destination address in bits of at least a part thereof and an address including the plurality of memory input bits output in the plurality of logical operations is selected to be output as the memory input address, and the selected memory input address is supplied to the device under test, when the memory input address is supplied to the device under test.

10. The recording medium as claimed in claim 9, wherein a correspondence between the physical address and the memory input address is acquired;

whether address translation designated by the acquired correspondence is capable of being performed by means of the mask arithmetic operation and the logical operation is decided;

the plurality of mask registers are set when it has been judged that the address translation is capable of being performed by means of the logical operation and contents of the translation memory are set when it has been judged that the address translation is not capable of being performed by means of the logical operation; and in the selecting, the selecting section is set so that the address including the plurality of memory input bits output as a result of the logical operation is output as the memory input address when it has been judged that the address translation is capable of being performed by means of the logical operation, and the address including the destination address in bits of at least a part thereof is output as the memory input address when it has been judged that the address translation is not capable of being performed by means of the logical operation.

11. A test method for testing a device under test by means of a test apparatus, comprising:

generating a physical address to be supplied to a memory block inside the device under test;

masking, in correspondence with each of a plurality of memory input bits constituting at least a part of a memory input address to be supplied to the device under test, each of a plurality of physical bits constituting at least a part of the physical address in accordance with a value of a mask register corresponding to this memory input bit;

respectively outputting bit data obtained by performing a predetermined logical operation on the plurality of physical bits in correspondence with each of the plurality of memory input bits as the memory input bit; and supplying the memory input address including the output plurality of memory input bits to the device under test.

12. The test method as claimed in claim 11, wherein when bit data obtained by performing a logical operation is output as the memory input bit, an exclusive OR of the masked plurality of physical bits is computed and the bit data based on the computed exclusive OR is output as the memory input bit.

13. The test method as claimed in claim 12, wherein in correspondence with each of the plurality of memory input bits, whether a logical value of the exclusive OR is reversed and output as the memory input bit is set.

14. The test method as claimed in claim 11, wherein based on a translated address consisting of bits of at least a part of the physical address, a destination address is output by using a translation memory that outputs data associated with this translated address as the destination address, one of an address including the destination address in bits of at least a part thereof and an address including the plurality of memory input bits output in the plurality of logical operations is selected to be output as the memory input address, and the selected memory input address is supplied to the device under test, when the memory input address is supplied to the device under test.

15. The test method as claimed in claim 14, wherein a correspondence between the physical address and the memory input address is acquired;

whether address translation designated by the acquired correspondence is capable of being performed by means of the mask arithmetic operation and the logical operation is decided;

the plurality of mask registers are set when it has been judged that the address translation is capable of being performed by means of the logical operation and contents of the translation memory are set when it has been judged that the address translation is not capable of being performed by means of the logical operation; and in the selecting, the selecting section is set so that the address including the plurality of memory input bits output as a result of the logical operation is output as the memory input address when it has been judged that the address translation is capable of being performed by means of the logical operation, and the address including the destination address in bits of at least a part thereof is output as the memory input address when it has been judged that the address translation is not capable of being performed by means of the logical operation.

* * * * *